United States Patent
Chow et al.

(10) Patent No.: US 7,217,977 B2
(45) Date of Patent: May 15, 2007

(54) COVERT TRANSFORMATION OF TRANSISTOR PROPERTIES AS A CIRCUIT PROTECTION METHOD

(75) Inventors: Lap-Wai Chow, South Pasadena, CA (US); William M. Clark, Jr., Camarillo, CA (US); James P. Baukus, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/828,022

(22) Filed: Apr. 19, 2004

(65) Prior Publication Data

US 2005/0230787 A1 Oct. 20, 2005

(51) Int. Cl.
H01L 31/062 (2006.01)
H01L 31/113 (2006.01)

(52) U.S. Cl. .............. 257/344; 257/368; 257/369; 257/371; 257/408; 257/E21.137

(58) Field of Classification Search ........ 257/368–369, 257/371, 344, 336, 408, E21.371
See application file for complete search history.

(56) References Cited

U.S. PATENT DOCUMENTS

| | | | |
|---|---|---|---|
| 3,673,471 A | 6/1972 | Klein et al. ............... 257/407 |
| 3,946,426 A | 3/1976 | Sanders .................... 357/71 |
| 3,983,620 A | 10/1976 | Spadea .................... 438/218 |
| 4,017,888 A | 4/1977 | Christie et al. ............ 357/54 |
| 4,101,344 A | 7/1978 | Kooi et al. ................ 148/1.5 |
| 4,143,854 A | 3/1979 | Vetter ....................... 358/188 |
| 4,145,701 A | 3/1979 | Kawagoe .................. 257/391 |
| 4,164,461 A | 8/1979 | Schilling ............. 204/192 EC |
| 4,196,443 A | 4/1980 | Dingwall ................... 257/774 |
| 4,267,578 A | 5/1981 | Vetter ....................... 364/709 |
| 4,291,391 A | 9/1981 | Chatterjee et al. ......... 365/184 |
| 4,295,897 A | 10/1981 | Tubbs et al. ............... 148/1.5 |
| 4,314,268 A | 2/1982 | Yoshioka et al. ............ 357/48 |
| 4,317,273 A | 3/1982 | Guterman et al. ........... 29/571 |
| 4,322,736 A | 3/1982 | Sasaki et al. .............. 257/369 |
| 4,374,454 A | 2/1983 | Jochems .................... 29/571 |
| 4,409,434 A | 10/1983 | Basset et al. .............. 380/265 |
| 4,435,895 A | 3/1984 | Parrillo .................... 29/571 |
| 4,471,376 A | 9/1984 | Morcom et al. ............. 357/71 |

(Continued)

FOREIGN PATENT DOCUMENTS

EP 0 186 855 A2 7/1986

(Continued)

OTHER PUBLICATIONS

U.S. Appl. No. 09/696,826, filed Oct. 25, 2000, Baukus et al.

(Continued)

*Primary Examiner*—Kenneth Parker
*Assistant Examiner*—Joseph Nguyen
(74) *Attorney, Agent, or Firm*—Ladas & Parry LLP (57) ABSTRACT

A technique for and structures for camouflaging an integrated circuit structure. The technique includes the use of a light density dopant (LDD) region of opposite type from the active regions resulting in a transistor that is always off when standard voltages are applied to the device.

18 Claims, 5 Drawing Sheets

U.S. PATENT DOCUMENTS

| | | | |
|---|---|---|---|
| 4,530,150 A | 7/1985 | Shirato | 29/576 B |
| 4,581,628 A | 4/1986 | Miyauchi et al. | 357/71 |
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,636,822 A | 1/1987 | Codella et al. | 257/345 |
| 4,727,038 A | 2/1988 | Watabe et al. | 438/304 |
| 4,727,493 A | 2/1988 | Taylor, Sr. | 364/490 |
| 4,729,001 A | 3/1988 | Haskel | 257/345 |
| 4,753,897 A | 6/1988 | Lund et al. | 438/296 |
| 4,766,516 A | 8/1988 | Ozdemir et al. | 361/380 |
| 4,799,096 A | 1/1989 | Koeppe | 357/42 |
| 4,821,085 A | 4/1989 | Haken et al. | 357/67 |
| 4,829,356 A | 5/1989 | Arndt | 357/35 |
| 4,830,974 A | 5/1989 | Chang et al. | 437/34 |
| 4,912,053 A | 3/1990 | Schrantz | 438/188 |
| 4,939,567 A | 7/1990 | Kenney | 257/383 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,015,596 A | 5/1991 | Toyoda et al. | 437/41 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,073,812 A | 12/1991 | Shimura | 357/34 |
| 5,101,121 A | 3/1992 | Sourgen | 307/465 |
| 5,117,276 A | 5/1992 | Thomas et al. | 357/71 |
| 5,120,669 A | 6/1992 | Schrantz | 437/41 |
| 5,121,089 A | 6/1992 | Larson | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,225,699 A | 7/1993 | Nakamura | 257/306 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A | 5/1994 | Roberts | 257/401 |
| 5,336,624 A | 8/1994 | Walden | 437/34 |
| 5,341,013 A | 8/1994 | Koyanagi et al. | 257/368 |
| 5,345,105 A | 9/1994 | Sun et al. | 257/659 |
| 5,354,704 A | 10/1994 | Yang et al. | 437/52 |
| 5,369,299 A | 11/1994 | Byrne et al. | 257/638 |
| 5,371,390 A | 12/1994 | Mohsen | 257/209 |
| 5,376,577 A | 12/1994 | Roberts et al. | 437/52 |
| 5,384,472 A | 1/1995 | Yin | 257/204 |
| 5,384,475 A | 1/1995 | Yahata | 257/314 |
| 5,399,441 A | 3/1995 | Bearinger et al. | 428/689 |
| 5,404,040 A | 4/1995 | Hshieh et al. | 257/341 |
| 5,412,237 A | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,677,557 A | 10/1997 | Wuu et al. | 257/382 |
| 5,679,595 A | 10/1997 | Chen et al. | 437/52 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,375 A | 7/1998 | Twist | 430/414 |
| 5,783,846 A | 7/1998 | Baukus et al. | 257/204 |
| 5,821,147 A | 10/1998 | Kizilyali | 438/305 |
| 5,821,590 A | 10/1998 | Lee et al. | 257/377 |
| 5,834,356 A | 11/1998 | Bothra et al. | 438/384 |
| 5,838,047 A | 11/1998 | Yamauchi et al. | 257/372 |
| 5,854,510 A | 12/1998 | Sur, Jr. et al. | 257/529 |
| 5,858,843 A | 1/1999 | Doyle et al. | 438/299 |
| 5,866,933 A | 2/1999 | Baukus et al. | 257/368 |
| 5,880,503 A | 3/1999 | Matsumoto et al. | 257/372 |
| 5,888,887 A | 3/1999 | Li et al. | 438/525 |
| 5,895,241 A | 4/1999 | Lu et al. | 438/275 |
| 5,920,097 A | 7/1999 | Horne | 257/368 |
| 5,930,663 A | 7/1999 | Baukus et al. | 438/598 |
| 5,930,667 A | 7/1999 | Oda | 438/622 |
| 5,933,737 A | 8/1999 | Goto | 438/291 |
| 5,973,375 A | 10/1999 | Baukus et al. | 257/399 |
| 5,977,593 A | 11/1999 | Hara | 257/356 |
| 5,998,257 A | 12/1999 | Lane et al. | 438/253 |
| 6,010,929 A | 1/2000 | Chapman | 438/226 |
| 6,037,627 A | 3/2000 | Kitamura et al. | 257/324 |
| 6,044,011 A | 3/2000 | Marr et al. | 365/154 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,064,110 A | 5/2000 | Baukus et al. | 257/652 |
| 6,080,614 A | 6/2000 | Neilson et al. | 438/238 |
| 6,093,609 A | 7/2000 | Chuang | 438/286 |
| 6,117,762 A | 9/2000 | Baukus et al. | 438/618 |
| 6,137,318 A | 10/2000 | Takaaki | 326/112 |
| 6,153,484 A | 11/2000 | Donaton et al. | 438/301 |
| 6,154,388 A | 11/2000 | Oh | 365/185.04 |
| 6,215,158 B1 | 4/2001 | Choi | 257/368 |
| 6,261,912 B1 | 7/2001 | Hsiao et al. | 438/301 |
| 6,294,816 B1 | 9/2001 | Baukus et al. | 257/368 |
| 6,326,675 B1 | 12/2001 | Scott et al. | 257/608 |
| 6,365,453 B1 | 4/2002 | Deboer et al. | 438/253 |
| 6,373,106 B2 | 4/2002 | Maki et al. | 257/369 |
| 6,410,413 B2 | 6/2002 | Scott et al. | 438/601 |
| 6,503,787 B1 | 1/2003 | Choi | 438/214 |
| 6,740,942 B2 | 5/2004 | Baukus et al. | 257/406 |
| 6,825,530 B1 | 11/2004 | Brown et al. | 257/337 |
| 6,911,694 B2* | 6/2005 | Negoro et al. | 257/336 |
| 6,933,560 B2* | 8/2005 | Lee et al. | 257/328 |
| 2002/0058368 A1 | 5/2002 | Tseng | 438/183 |
| 2002/0173131 A1 | 11/2002 | Clark, Jr. et al. | 438/598 |
| 2003/0057476 A1 | 3/2003 | Morita et al. | 257/327 |
| 2004/0061185 A1 | 4/2004 | Chow et al. | 257/399 |
| 2004/0075147 A1* | 4/2004 | Ueda et al. | 257/368 |
| 2004/0099912 A1 | 5/2004 | Chow et al. | 257/368 |
| 2004/0144998 A1 | 7/2004 | Chow et al. | 257/213 |
| 2004/0164361 A1 | 8/2004 | Baukus et al. | 257/402 |

FOREIGN PATENT DOCUMENTS

| | | |
|---|---|---|
| EP | 0 364 769 | 4/1990 |
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2 486 717 | 1/1982 |
| JP | 58-190064 | 11/1983 |
| JP | 61-147551 | 7/1986 |
| JP | 63-129647 A | 6/1988 |
| JP | 02-046762 | 2/1990 |
| JP | 2 188 944 | 7/1990 |

| JP | 02-188944 | 7/1990 |
| JP | 02-237038 | 9/1990 |
| JP | 04-028092 | 1/1992 |
| JP | 10-256398 | 9/1998 |
| WO | 98/21734 | 5/1998 |
| WO | 98/57373 | 12/1998 |
| WO | 00/44012 | 7/2000 |

OTHER PUBLICATIONS

U.S. Appl. No. 09/758,792.
U.S. Appl. No. 10/881,286, filed Jun. 29, 2004, Chow et al.
Blythe, et al., "Layout Reconstruction of Complex Silicon Chips," *IEEE Journal of Solid-State Circuits*, vol. 28, No. 2, pp. 138-145 (Feb. 1993).
Frederiksen, Thomas M., "Standard Circuits in the New CMOS Era," *Intuitive CMOS Electronics*, Revised Edition, pp. 134-146 (Jan. 1989).
Hodges and Jackson, *Analysis and Design of Digital Integrated Circuits*, 2nd edition, McGraw-Hill, p. 353 (1988).
IBM_TDB, "Double Polysilicon Dynamic Memory Cell with Polysilicon Bit Line," vol. 21, Issue No. 9, pp. 3828-3831 (Feb. 1979).
IBM_TDB, "Static Ram Double Polysilicon Process," vol. 23, Issue No. 8 pp. 3683-3686 (Jan. 1981).
Larson, L. E., et al., "Microactuators for GaAs-based Microwave Integrated Circuits," *IEEE*, pp. 743-746 (1991).
Lee, "Engineering a Device for Electron-Beam Probing," *IEEE Design and Test of Computers*, pp. 36-49 (Jun. 1989).
Ng, K.K., *Complete Guide to Semiconductor Devices*, McGraw-Hill, Inc., pp. 164-165 (1995).
Sze, S.M., *VLSI Technology*, McGraw-Hill, pp. 99, 447, 461-465 (1983).
Sze, S.M., ed., "Silicides for Gates and Interconnections," *VLSI Technology*, McGraw-Hill, pp. 372-380 (1983).
U.S. Appl. No. 10/637,848, filed Aug. 7, 2003, Chow et al.
U.S. Appl. No. 10/735,841, filed Dec. 13, 2003, Chow et al.
U.S. Appl. No. 10/789, 261, filed Feb. 26, 2004, Baukus et al.

* cited by examiner

COVERT TRANSFORMATION OF TRANSISTOR PROPERTIES AS A CIRCUIT PROTECTION METHOD

CROSS REFERENCE TO RELATED APPLICATIONS

This application is related to U.S. patent application Ser. No. 10/881,286, entitled "Symmetric Non-Intrusive and Covert Technique to Render a Transistor Permanently Non-Operable".

TECHNICAL FIELD

The technology disclosed herein relates to integrated circuits (ICs) and semiconductor devices in general and their methods of manufacture wherein the integrated circuits and semiconductor devices employ camouflaging techniques which make it difficult for the reverse engineer to discern how the semiconductor device functions.

RELATED TECHNOLOGY

The presently disclosed technology is related to the following US patents:
(1) U.S. Pat. Nos. 5,866,933; 5,783,375 and 6,294,816 teach transistors in a CMOS circuit that are connected by implanted (and therefore hidden and buried) lines between the transistors by modifying the p+ and n+ source/drain masks. These implanted interconnections form 3-input AND or OR circuits that look substantially identical to the reverse engineer. Also, buried interconnects force the reverse engineer to examine the IC in greater depth to try to figure out the connectivity between transistors and hence their function.
(2) U.S. Pat. Nos. 5,783,846; 5,930,663 and 6,064,110 teach a further modification in the implant masks so that the implanted connecting lines between transistors have a gap inserted, with approximately the length of the minimum feature size of the CMOS technology being used. If this gap is "filled" with one kind of implant, the line conducts; but if it is "filled" with another kind of implant, the line does not conduct. The intentional gaps are called channel blocks. The reverse engineer is forced to determine connectivity on the basis of resolving the implant type at the minimum feature size of the CMOS process being used.
(3) U.S. Pat. No. 6,117,762 teaches method and apparatus for protecting semiconductor integrated circuits from reverse engineering. Semiconductor active regions are formed on a substrate and a silicide layer is formed both over at least one active region of the semiconductor active regions and over a selected substrate area for interconnecting the at least one active region with another region through the silicide formed on the selected substrate area. This connection, as affected by the silicide layer, is substantially invisible to the reverse engineer unless imaged via cross-sectional techniques, which are prohibitively costly and time consuming.

BACKGROUND INFORMATION

The creation of complex integrated circuits and semiconductor devices can be a very expensive undertaking given the large number of hours of sophisticated engineering talent involved in designing such devices. Additionally, integrated circuits can include read only memories and/or EEPROMs into which software, in the form of firmware, is encoded. Additionally, integrated circuits are often used in applications involving the encryption of information. Therefore, in order to keep such information confidential (i.e. design, critical information and encryption), it is desirable to keep such devices from being reverse engineered. Thus, there are a variety of reasons for protecting integrated circuits and other semiconductor devices from being reverse engineered.

In order to keep the reverse engineer at bay, different techniques are known in the art to make integrated circuits more difficult to reverse engineer. One technique is to alter the composition or structures of the transistors in the circuit in such a way that the alteration is not easily apparent, forcing the reverse engineer to carefully analyze each transistor (in particular, each CMOS transistor pair for CMOS devices), and thwarting attempts to use automatic circuit and pattern recognition techniques in order to reverse engineer an integrated circuit. Since integrated circuits can have hundreds of thousands or even millions of transistors, forcing the reverse engineer to carefully analyze each transistor in a device can effectively frustrate the reverse engineer's ability to reverse engineer the device successfully.

A conductive layer, such as silicide, is often used during the manufacturing of semiconductor devices. In modern CMOS processing, especially with a feature size below 0.5 µm, a silicide layer is utilized to improve the conductivity of gate, source and drain contacts. In accordance with general design rules, any active region providing a source or drain is silicided. This silicide layer is very thin and difficult for the reverse engineer to see. Hence, if there are ways to modify the transistor through the modification of the silicide layer so as to change the transistor functionality then the modification would be difficult to determine.

Figure 1:
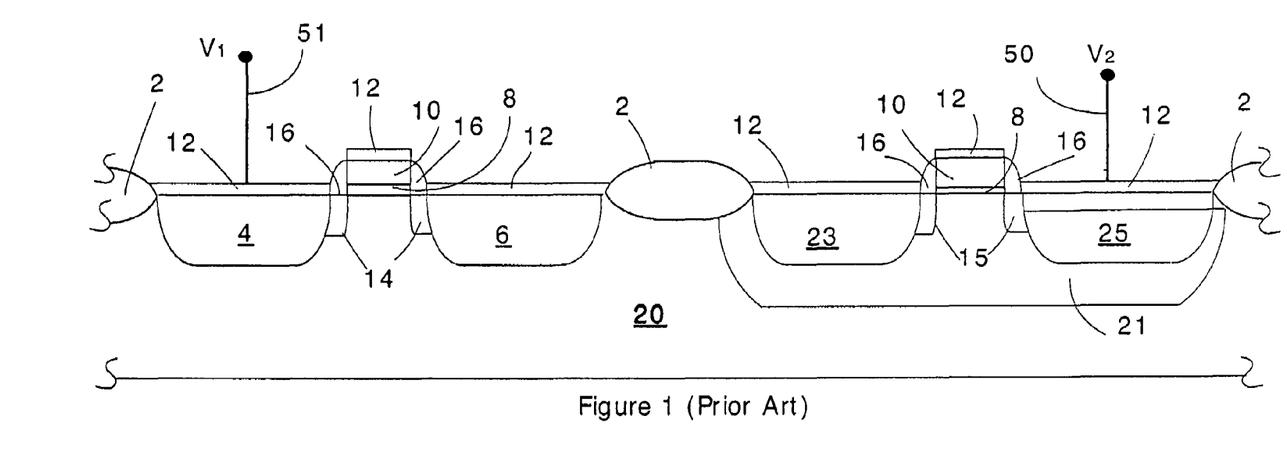
FIG. 1 depicts prior art cross-section of a CMOS device with LDD regions.

FIG. 1 depicts a prior art modern CMOS device. In this example, the substrate 20 is a p-type substrate. Referring to the NMOS device, active regions 4, 6 disposed in the substrate 20 have n-type conductivity. The light density dopant (LDD) regions 14 have the same conductivity type as active regions 4, 6, but with a much lower dose than active regions 4, 6. The gate comprises a gate oxide layer 8, and a self-aligned polysilicon gate 10. Oxide sidewall spacers 16 form the differentiation between the active regions 4, 6 and the LDD regions 14. Field oxide 2 provides separation between transistors. Referring to the PMOS device, a well 21 of n-type conductivity is disposed in the substrate 20. Active regions 23, 25 having p-type conductivity are disposed within n-type well 21. LDD regions 15 have the same conductivity type as active regions 23, 25, but with a much lower dose than active regions 23, 25. The gate comprises a gate oxide layer 8, and a self-aligned polysilicon gate 10. Oxide sidewall spacers 16 form the differentiation between the active regions 23, 25 and the LDD regions 15. The silicide layer 12, is deposited and sintered over the active regions 4, 6, 23, 25 to make better contact. The silicide layer 12, is optionally deposited over the poly gates 10 as well. For the prior art CMOS device of FIG. 1, the NMOS or PMOS transistors normally turn "ON" when a voltage is applied to $V_1$ 51 or $V_2$ 50, respectively.

Many prior art techniques for discouraging or preventing reverse engineering of a circuit cause the IC to look different from a standard IC. Techniques are needed in which the transistors, and thus the circuits, are constructed to look essentially the same as conventional circuits, but where the functionality of selected transistors, and hence their circuits, is varied. The minor differences between the conventional circuit and the modified circuit should be difficult to detect by reverse engineering processes. In addition, the techniques should strive to modify only a vendor's library design instead of forming a completely new and differently appearing library. Requiring only modification to an existing library results in a simpler path to implementation.

SUMMARY OF THE PRESENTLY DISCLOSED TECHNOLOGY

It is an object of the presently disclosed technology to make reverse engineering even more difficult and, in particular, to offset or shift the active regions away from the gate and to use LDD regions of a conductivity type opposite to that of the active regions resulting in a transistor that is always off when standard voltages are applied to the device. It is believed that this will make the reverse engineer's efforts all the more difficult in terms of making it very time consuming and perhaps exceedingly impractical, if not impossible, to reverse engineer a chip employing the presently disclosed technology.

The Inventors named herein have previously filed patent applications and have received patents in this general area of technology, that is, relating to the camouflage of integrated circuit devices in order to make it more difficult to reverse engineer them. The technology disclosed herein can be used harmoniously with the techniques disclosed above in the prior United States patents to further confuse a reverse engineer.

Note that the presently disclosed technology might only be used one in a thousand instances of transistor structures occurring on the chip in question, but the reverse engineer will have to look very carefully at each transistor structure or connection knowing full well that for each transistor structure or connection that he or she sees, there is a very low likelihood that it has been modified by the presently disclosed technology. The reverse engineer will be faced with having to find the proverbial needle in a haystack.

The presently disclosed technology includes a method of manufacturing a semiconductor device in which some selected non-operable transistors look the same as the operable transistors, but which have a modified LDD implant which renders them inoperable. The modified LDD implant is of an opposite conductivity type than the conductivity of the active regions of the transistor, and hence these implants will result in a transistor that will not turn on when normally biased.

In another aspect, depending on the design rules of the fabrication process, the present invention will offset the silicide on one side of the transistor so as to ensure that the LDD region is isolated from the silicide in order to prevent leakage that might cause the transistor to turn on.

In another aspect, the present invention provides a camouflaged circuit structure, comprising: a substrate; a plurality of active regions having a first conductivity type disposed in said substrate; and at least one light density dopant region having a second conductivity type, said at least one light density dopant region being adjacent to at least one of said plurality of active regions, wherein said camouflaged circuit structure is non-operational for a nominal voltage applied to said camouflaged circuit structure.

In another aspect, the present invention provides a method of camouflaging a circuit comprising the steps of: providing at least one light density dopant region having an opposite conductivity type of an adjacent active region; and modifying an active region mask such that said at least one light density dopant region is sufficiently large to avoid punch through for nominal voltages applied to said camouflaged circuit, wherein said circuit remains OFF when any nominal voltage is applied to said circuit.

In another aspect, the present invention provides a non-operable transistor comprising: a substrate; a first active region having a first conductivity type disposed in said substrate; a second active region having a second conductivity type disposed in said substrate; a first light density dopant region adjacent said first active region, said first light density dopant region having a second conductivity type; a second light density dopant region adjacent said second active region, said second light density dopant region having a first conductivity type; and a gate structure disposed adjacent said first light density dopant region and said second light density dopant region.

DETAILED DESCRIPTION

Semiconductor device manufacturing employs many techniques, process steps, and technologies that are well known. These techniques, process steps and technologies vary with feature size, material composition and other specific device attributes. The following is a general discussion of modifications that may be made to the masks used in manufacturing a CMOS device. The discussion below is provided as an example only.

Figure 2A:
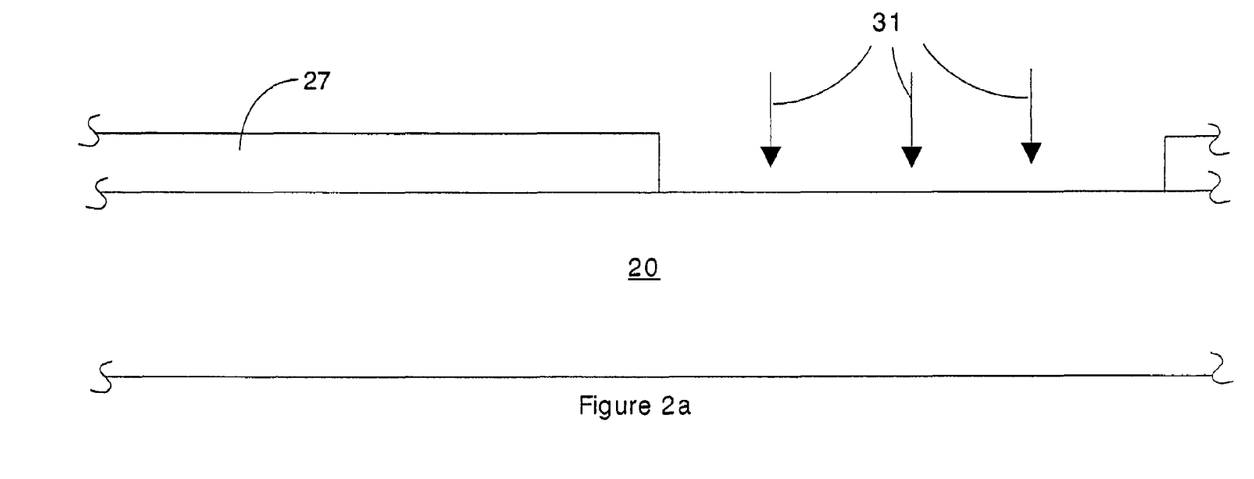
FIGS. 2a through 2g depict various steps in the manufacturing of a camouflaged integrated circuit structure in accordance with the present invention.
Figure 2B:
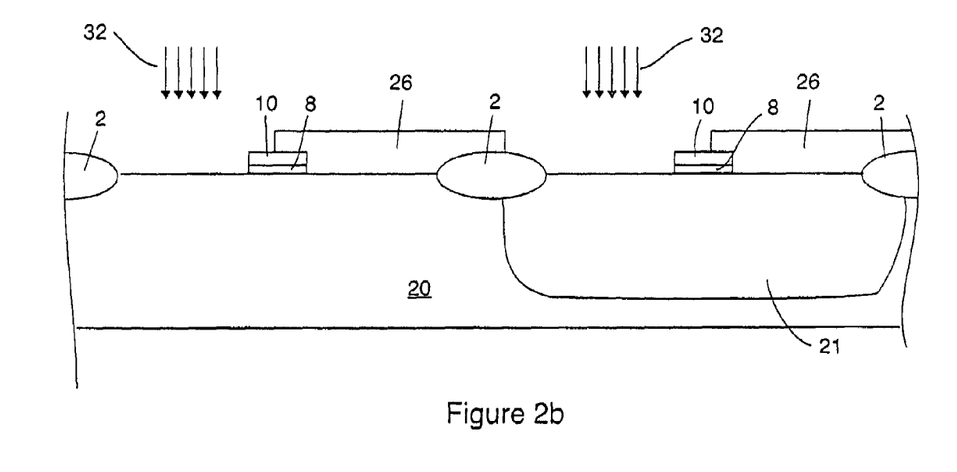

FIG. 2a depicts a substrate 20, for purposes of this discussion the substrate 20 is a p-type substrate; however the substrate could alternatively be a n-type substrate. A mask layer 27 is disposed over substrate 20 and photolithographically patterned to act as a mask for subsequent implantation. The substrate 20 is then exposed to ions 31. Ions 31 are chosen such that the ions 31, when implanted in substrate 20, will result in a well of opposite conductivity type to that of substrate 20 (e.g. a n-type well 21 for the case of a p-type substrate 20). The mask layer 27 is removed and another mask (not shown) is disposed over substrate 20 and photolithographically patterned to act as a mask for subsequent thermal oxide growth. The substrate 20 is heated and field oxide 2 is grown as shown in FIG. 2b. The second mask is then removed.

Figure 2C:
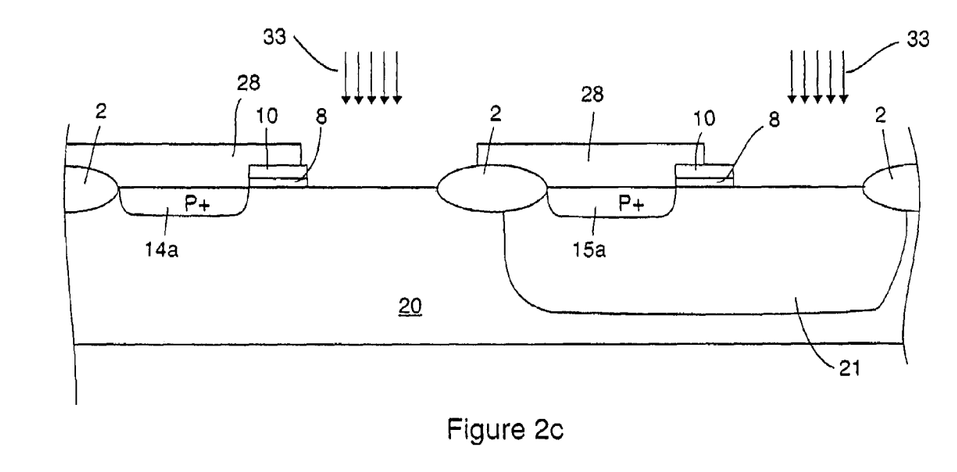

In FIG. 2b, the field oxide 2 acts to separate the transistors. The left side of the substrate will become an inoperable NMOS device in this embodiment, while the right side of the substrate will become an inoperable PMOS device in this embodiment. Then, a gate oxide layer 8 and a polysilicon layer 10 are preferably disposed over the substrate 20. The polysilicon layer 10 and gate oxide layer 8 are etched to form poly gates for the inoperable NMOS and PMOS devices. Another mask 26 is photolithographically patterned as shown over the CMOS device leaving openings over one side of the NMOS portion of the CMOS device and over one side of the PMOS portion of the CMOS device. The substrate 20 is then exposed to ions 32. This results in light density dopant (LDD) regions 14a, 15a, as shown in FIG. 2c, with one LDD region being associated with the one of the PMOS and NMOS transistors and the other LLD regions being associated with the other one of the PMOS and NMOS transistors. The ions 32 are chosen such that the LDD regions 14a, 15a are of the same conductivity type as substrate 20 (e.g. p-type in the case of a p-type substrate 20). One skilled in the art will appreciate that mask 26 does not need to be a separate step, but instead, when the polysilicon layer 10 and gate oxide layer 8 are etched, they may be initially partially etched to provide an opening for ions 32 and then etched to fully define the poly gates.

Figure 2D:
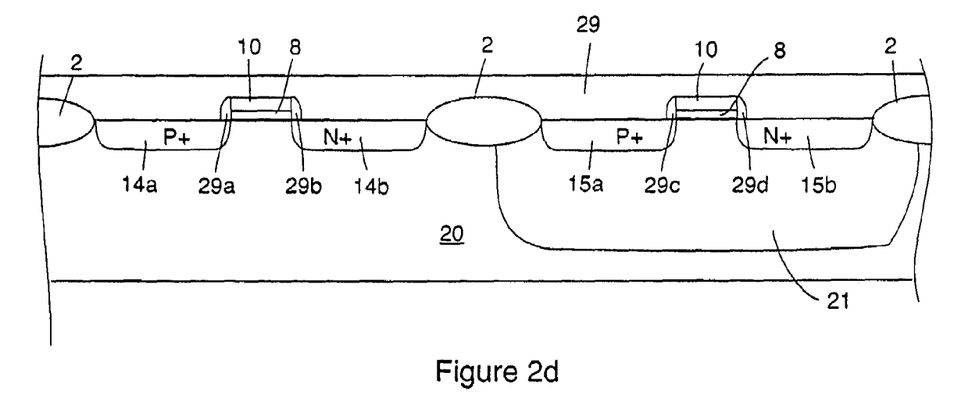

In FIG. 2c, the mask 26, if used, is removed. Alternatively, the polysilicon layer 10 and gate oxide layer 8 are etched to form the poly gate. A mask 28 is then disposed over the CMOS device and photolithographically patterned as shown covering the previously formed LDD regions 14a, 15a. The substrate 20 is exposed to ions 33. This results in light density dopant (LDD) regions 14b, 15b, as shown in FIG. 2d. In this example, the ions 33 are chosen such that the LDD regions 14b, 15b are of an opposite conductivity type to substrate 20 (e.g. n-type in the case of a p-type substrate 20).

In FIG. 2d, a layer of oxide 29 is disposed over the substrate 20. The oxide layer 29 is then etched, by a timed etch, such that the oxide is removed from atop the source and drain regions 14a, 14b, 15a and 15b leaving behind oxide shoulders 29a, 29b, 29c and 29d. The shoulders provide sidewall spacers which help provide a mask for standard source and drain implants as described above with reference to FIG. 1. In the case of a conventional working CMOS device, two source/drain implant masks, one for a p-implant and one for a n-implant, would each be patterned to have large openings whereby the entire n or p, as the case may be, active areas are exposed and implanted. The poly gates 10 and their associated sidewall spacers and the field oxide regions 2 provide pattern definition so that when implantation occurs, the gate 10 is self-aligned in the case of a conventional working CMOS device. In order to render at least one of the CMOS devices on a chip inoperative, the conventionally used source/drain implant masks are modified so that instead of the poly gates 10 and their associated sidewall spacers providing pattern definition, the mask is modified to shift the location of the edge of the implant away from the gate 10. This shifting can occur on one or both sides of a given gate 10. This shifting will now be described in greater detail with reference to FIGS. 2e and 2f.

Figure 2E:
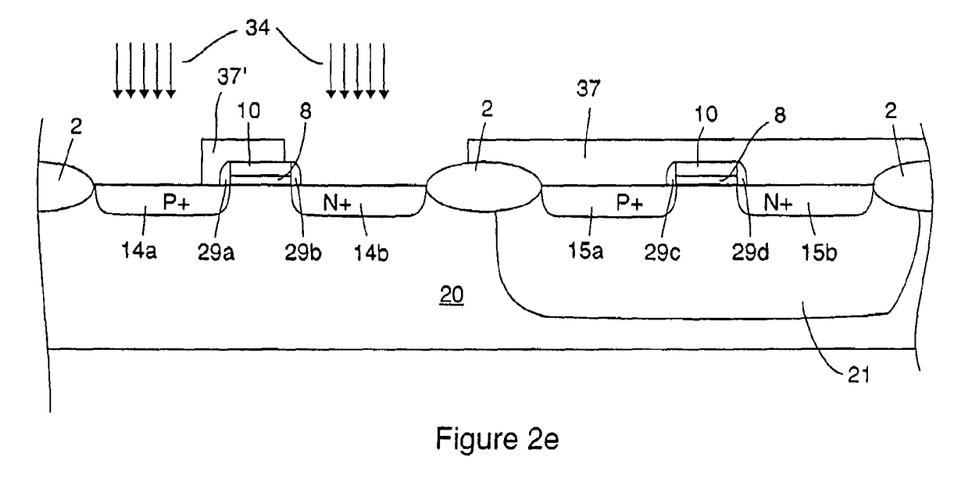

In FIG. 2e, the N++ source/drain implant 34 for the NMOS side of the inoperative device is defined by a patterned mask 37. It should be noted that this mask preferably has an additional opaque region (compared to the mask used for a working CMOS device), which is labeled 37' and which shifts an edge of the resulting N++ doped region 34 (see FIG. 2f) away from the edge of sidewall spacer 29a (where the implant would normally occur in self-aligned devices). This shift also moves the doped region 34 away from gate 10. The size of the shift must be large enough to block current flow from the source to the drain under normal bias conditions and also to account for anticipated mask alignment errors and other process parameters.

Figure 2F:
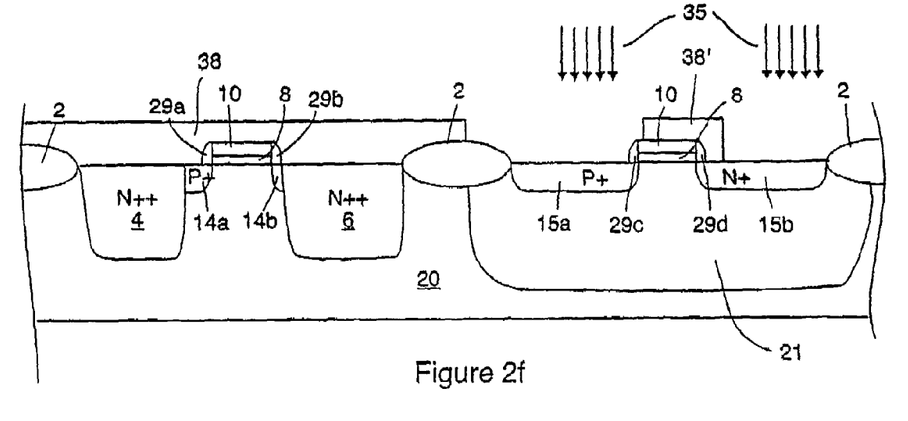

Similarly, the PMOS side of the device receives the P++ source/drain implant 35 for the PMOS side of the inoperative device is defined by a patterned mask 38 as shown in FIG. 2f. It should be noted that this mask has an additional opaque region (compared to the mask used for a working device), which is labeled 38' and which shifts an edge of resulting P++ doped region 25 (see FIG. 2g) away from the edge of sidewall spacer 29d (where the implant would normally occur in self-aligned devices). This shift also moves the doped region 25 away from gate 10. Again, the size of the shift must be large enough to block current flow from the source to the drain under normal bias conditions and also to account for anticipated mask alignment errors and other process parameters.

Figure 2G:
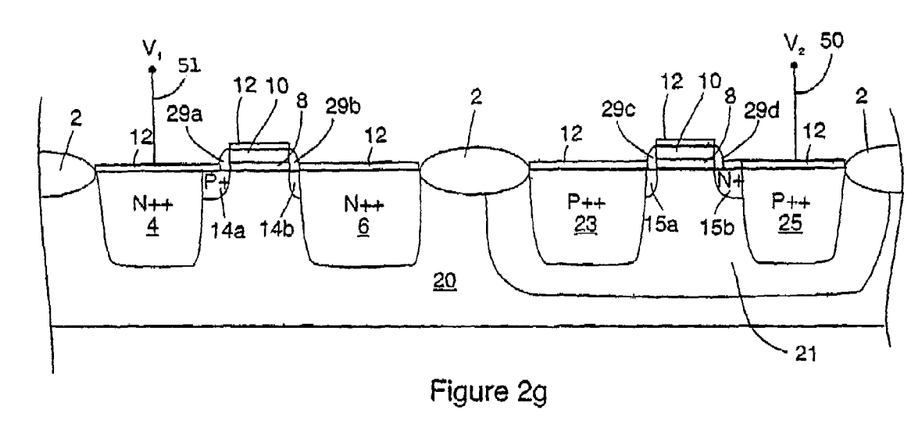

The ions 34 are selected such that the doped regions 4,6 are of an opposite conductivity type to that of LDD region 14a, but are of the same conductivity type to that of LDD region 14b (n-type in this embodiment). The ions 35 are selected such that the doped regions 23, 25 are of an opposite conductivity type to that of LDD region 15b, but are of the same conductivity type to that of LDD region 15a (p-type in this embodiment).

The sidewall spacers 29a, 29b, 29c and 29d used for this inoperable device have the same dimensions as conventional sidewall spacers for an operable device. Thus, the reverse engineer would have no indication about the functionality of the device by the sizes of the sidewall spacers 29a, 29b, 29c, 29d. While the side wall spacers have a normal size, the underlying LLD regions can be larger than normal. Note that LDD region 14a has a width which is about twice (or more) as wide as spacer 29a and that LDD region 15b has a width which is about twice (or more) as wide as spacer 29d, but the actual sizes will depend on the amount of shift which is needed, as is explained above.

The resulting inoperable CMOS device is shown in FIG. 2g. Also, in FIG. 2g, an optional silicide layer 12 is disposed over the NMOS and PMOS devices. For the NMOS device, the silicide layer 12 allows for an electrical conductive path from $V_1$ 51 to substrate 20 through LDD region 14a, while the doped LDD region 14a also prevents an electrical path from active region 4 to active region 6. Thus, the NMOS device formed will be OFF for any standard voltage applied to $V_1$ 51. For the PMOS device, the silicide layer 12 allows for an electrical conductive path from $V_2$ 50 to n-well 21 through LDD region 15b, while the doped LDD region 15b also prevents an electrical path from active region 25 to active region 23. Thus, the device formed will be OFF for any standard voltage applied to $V_2$ 50.

Figure 3:
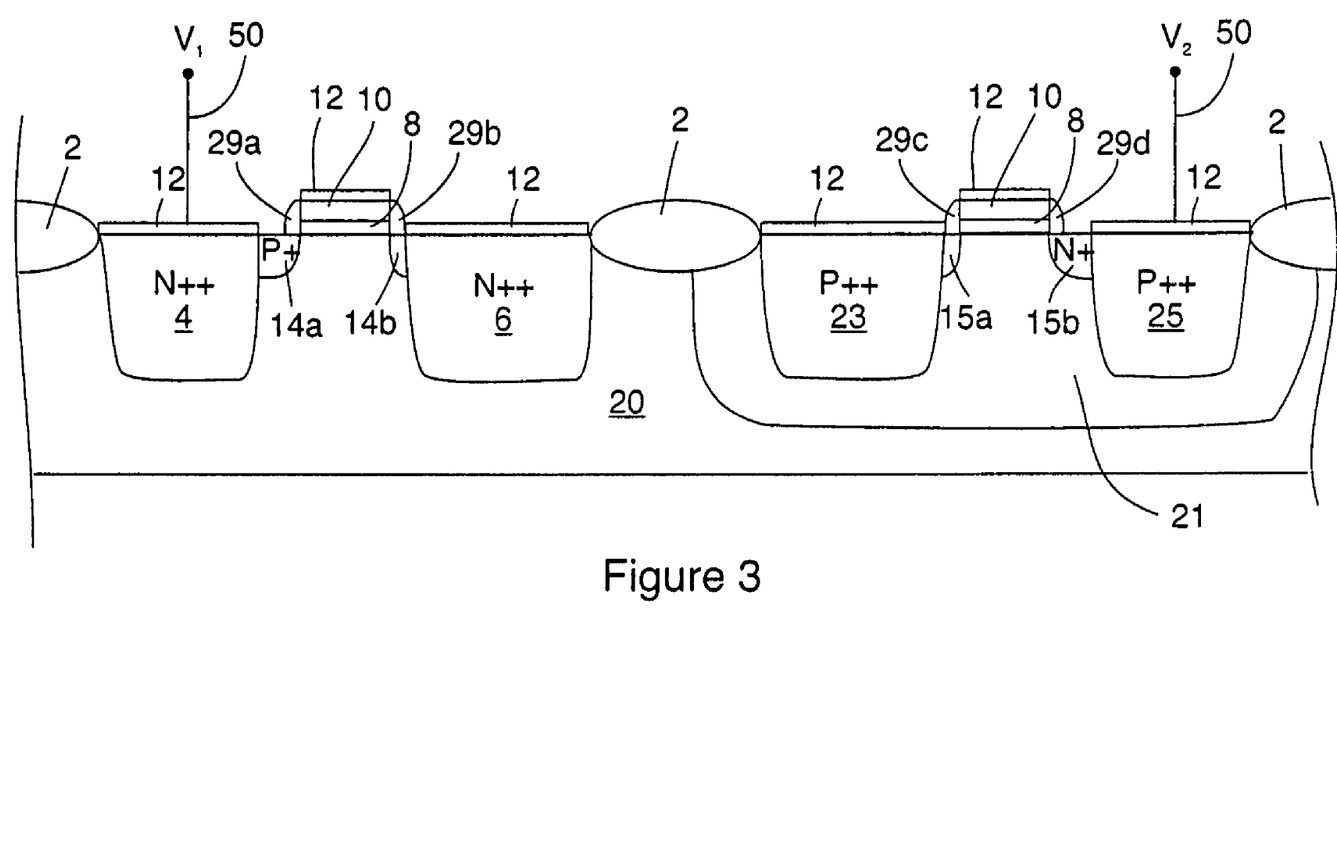
FIG. 3 depicts a cross-section of another embodiment of a CMOS device manufactured in accordance with the present invention.

One skilled in the art will appreciate that the shorting of the NMOS device to the substrate would not be preferred if the voltage applied to the substrate 20 was not the same as the voltage applied to $V_1$ 51. Many NMOS devices are connected such that the substrate 20 and $V_1$ 51 are connected to $V_{SS}$. However, if the voltage applied to substrate 20 was not the same as the voltage applied to $V_1$ 51, then a silicide block mask would be used to provide a silicide gap that prevents the silicide layer 12 from extending over LDD region 14a, as shown in FIG. 3. Therefore, the silicide layer would be unable to provide an electrical path from $V_1$ 51 to substrate 20 through LDD region 14a. However, the presence of the LDD region 14a being oppositely doped from active regions 4, 6 would prevent the transistor from turning ON when standard voltages are applied to $V_1$ 51. A silicide block mask could also be used to prevent the silicide from extending over LDD implant 15b, also shown in FIG. 3.

While the examples given in FIGS. 2a–2f and FIG. 3 depict the active regions 4, 25 being offset and thus slightly smaller, one skilled in the art will appreciate that instead of offsetting active regions 4, 25, active region 6 or active region 23 could be offset. Of course, this would require the doping of LDD region 14b or LDD region 15a to be of an opposite type than active region 6, or active region 23.

One skilled in the art will appreciate that there are many different types of CMOS manufacturing process with different feature sizes. The present invention may be applied to any CMOS manufacturing process. For purposes of further clarification, typical dimensions will be supplied for a 0.35 µm process.

For both the PMOS and NMOS devices, the dimensions of the field oxide portions 29a, 29b, 29c, 29d, determine the size of the LDD regions 14a, 14b, 15a and 15b. The LDD regions 14a, 15b, and thus the field oxide portions 29a, and 29d, are preferably chosen to be sufficiently large to avoid punch through for standard voltages applied to $V_2$ 50, or $V_1$ 51 and as small as possible in order to avoid detection. In an embodiment utilizing 0.35 µm process the standard LDD regions 14b, 15a are approximately 0.1 micrometers in width. As previously discussed, the modified LDD regions 14a, 15b are larger than the standard (or conventional) LDD regions 14b, 15a. In order to prevent punch through, the LDD regions 14b and 15a are preferably, approximately 0.2 micrometers wide when a voltage of approximately 3.5 Volts is applied to $V_1$ 50 or $V_2$ 51. Increasing the size of the LDD regions 14a, 15b results in a slight decrease in the size of the active regions 4, 25 normally found in a CMOS device.

For the NMOS device, the dimensions of the optional silicide gap are preferably chosen such that the optional silicide gap is ensured to be over at least the LDD region 14a or 15b, taking into account the alignment tolerances for the process, thus preventing $V_1$ 51 from shorting to the substrate 20. The dimensions of the optional silicide gap is dependent upon the mask alignment error for the process used. Typically, the optional silicide gap is less than 0.3 micrometers.

The presently disclosed technology provides an IC that is difficult to reverse engineer given that the size difference in the active regions is small, and the conductivity type of implant for a LDD region is very difficult to determine given the small dosage levels used in forming LDD regions. Additionally, the silicide layer is difficult to detect. As a result, the false transistor formed in accordance with the present invention will look operational to the reverse engineer. In a sea of millions of other transistors, these two features will be difficult to detect easily, thus forcing the reverse engineer to examine every transistor.

Additionally, the presently disclosed technology is preferably used not to completely disable a multiple transistor circuit in which the invention is used, but rather to cause the circuit to function in an unexpected or non-intuitive manner. For example, what appears to be an OR gate to the reverse engineer might really function as an AND gate. Or what appears as an inverting input might really be non-inverting. The possibilities are almost endless and are almost sure to cause the reverse engineer so much grief that he or she gives up as opposed to pressing forward to discover how to reverse engineer the integrated circuit device on which these techniques are utilized. This term "inoperable" as used herein in intended to cover possibilities where the resulting circuit is either inoperable or operates in an unexpected or non-intuitive manner.

In terms of making these devices, the foregoing description has been presented in terms implanting ions in order to form doped or implanted regions. Those skilled in the art will appreciate the fact that the doped regions can be formed by other techniques, such as diffusion doping.

Having described the presently disclosed technology in connection with certain preferred embodiments thereof, modification will now certainly suggest itself to those skilled in the art. As such, the presently disclosed technology is not to be limited to the disclosed embodiments, except as is specifically required by the appended claims.

What is claimed is:

1. A camouflaged circuit structure, comprising:
   a substrate;
   a gate structure disposed on the substrate:
   a plurality of active regions of a first conductivity type disposed in said substrate; and
   at least one light density doped region having a second conductivity type, said at least one light density dopant region being adjacent to at least one of said plurality of active regions, wherein said camouflaged circuit structure is non-operational for a nominal voltage applied to said camouflaged circuit structure;
   wherein the gate structure is disposed between two of the active regions, one of the two active regions being said at least one of said plurality of active regions and wherein said at least one of said plurality of active regions has an edge adjacent said gate structure which is spaced a first distance, and wherein the other one of the two active regions has an edge adjacent said gate structure which is spaced a second distance, the first distance being greater than the second distance.

2. The camouflaged circuit structure of claim 1 further comprising:
   voltage source for applying voltage to said camouflaged circuit structure, said voltage source for applying voltage disposed over said at least one of said plurality of active regions adjacent to said at least one light density dopant region; and
   a conductive layer disposed over said at least one light density dopant region and said at least one active region adjacent to said light density dopant region, wherein said conductive layer provides an electrical path from said voltage source for applying voltage to said at least one light density dopant region.

3. The camouflaged circuit structure of claim 2 wherein the conductive layer is a silicide layer.

4. The camouflaged circuit structure of claim 1 further comprising:
   a voltage source for applying voltage to said camouflaged circuit structure, said voltage source for applying voltage disposed over said at least one of said plurality of active regions adjacent to said at least one light density dopant region; and
   a conductive layer disposed over at least a portion of said active regions, the conductive layer having a gap therein disposed over said light density dopant region and a portion of said at least one active region adjacent to said light density dopant region, wherein said conductive layer gap prevents an electrical path from said voltage source for applying voltage to said at least one light density dopant region.

5. The camouflaged circuit structure of claim 4 wherein the conductive layer is a silicide layer.

6. The camouflaged circuit structure of claim 1 wherein the circuit structure is a CMOS device.

7. The camouflaged circuit structure of claim 1 further comprising a light density dopant region having a first conductivity type, wherein said light density dopant region having a first conductivity type is smaller than said at least one light density dopant region having a second conductivity type.

8. The camouflaged circuit structure of claim 1 wherein the gate structure comprises sidewall spacers, said at least one light density dopant region having a width which is at least 1.5 times the width of an adjacent sidewall spacer.

9. The camouflaged circuit structure of claim 1 wherein said at least one light density doped region controls the distance between the at least one of said plurality of active regions and the gate structure.

10. A non-operable transistor comprising:
a substrate;
a first active region having a first conductivity type disposed in said substrate;
a second active region having said first conductivity type disposed in said substrate;
a first light density dopant region having a second conductivity type adjacent said first active region;
a second light density dopant region adjacent said second active region;
a gate structure disposed adjacent said first light density dopant region and said second light density dopant region; and
wherein the first active region is spaced relatively further from said gate structure and the second active region is spaced relatively closer to said gate structure.

11. The non-operable transistor of claim 10 wherein the second light density dopant region has said first conductivity type.

12. The non-operable transistor of claim 11 further comprising:
a voltage source for applying voltage to said non-operable transistor, said voltage source for applying voltage disposed over said first active region; and
a conductive layer disposed over at least a portion of said first active region, the conductive layer having a gap therein disposed over said first light density dopant region and a portion of said first active region, wherein said conductive layer gap prevents an electrical path from said voltage source for applying voltage to said first light density dopant region.

13. The non-operable transistor of claim 12 wherein the conductive layer is a silicide layer.

14. The non-operable transistor of claim 11 wherein the non-operable transistor appears to be an operable transistor in a CMOS pair.

15. The non-operable transistor of claim 10 further comprising:
a voltage source for applying voltage to said non-operable transistor, said voltage source for applying voltage disposed over said first active region; and
a conductive layer disposed over said first light density dopant region and first active region, wherein said conductive layer provides an electrical path from said voltage source for applying voltage to said first light density dopant region.

16. The non-operable transistor of claim 15 wherein the conductive layer is a silicide layer.

17. The non-operable transistor of claim 15 wherein the first light density dopant region is larger than the second light density dopant region.

18. The non-operable transistor of claim 10 wherein said first light density dopant region controls the distance between the first active region and the gate structure, wherein said second light density dopant region controls the distance between the second active region and the gate structure.

* * * * *